United States Patent
Cheng et al.

(10) Patent No.: US 7,256,439 B2
(45) Date of Patent: Aug. 14, 2007

(54) TRENCH CAPACITOR ARRAY HAVING WELL CONTACTING MERGED PLATE

(75) Inventors: Kangguo Cheng, Beacon, NY (US); Babar A. Khan, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 10/905,808

(22) Filed: Jan. 21, 2005

(65) Prior Publication Data

US 2006/0163636 A1 Jul. 27, 2006

(51) Int. Cl.
*H01L 31/119* (2006.01)
(52) U.S. Cl. ................ 257/301; 257/E29.346
(58) Field of Classification Search ........... 257/301, 257/E29.346; 438/243, 386
See application file for complete search history.

(56) References Cited

U.S. PATENT DOCUMENTS

| | | | |
|---|---|---|---|
| 6,265,279 B1 | 7/2001 | Radens et al. | |
| 6,288,422 B1 | 9/2001 | Mandelman et al. | |
| 6,320,215 B1 | 11/2001 | Bronner et al. | |
| 6,339,239 B1 | 1/2002 | Alsmeier et al. | |
| 6,426,251 B2 | 7/2002 | Bronner et al. | |
| 6,432,774 B2* | 8/2002 | Heo et al. | 438/270 |
| 6,437,388 B1 | 8/2002 | Radens et al. | |
| 6,556,477 B2 | 4/2003 | Hsu et al. | |
| 6,566,177 B1 | 5/2003 | Radens et al. | |
| 6,670,234 B2 | 12/2003 | Hsu et al. | |
| 6,987,295 B2* | 1/2006 | Sell et al. | 257/301 |
| 2001/0004540 A1* | 6/2001 | Bronner et al. | 438/270 |
| 2005/0184326 A1* | 8/2005 | Cheng | 257/301 |

* cited by examiner

*Primary Examiner*—Wai-Sing Louie
*Assistant Examiner*—Mursalin B. Hafiz
(74) *Attorney, Agent, or Firm*—Daryl K. Neff, Esq.; Joseph P. Abate, Esq.

(57) ABSTRACT

According to an aspect of the invention, a structure is provided in which an array of trench capacitors includes a well contact to a merged buried plate diffusion region. The array, which is disposed in a substrate, includes a contact for receiving a reference potential. Each trench capacitor includes a node dielectric and a node conductor formed within the trench. Buried plate (BP) diffusions extend laterally outward from a lower portion of each trench of the array, the BP diffusions merging to form an at least substantially continuous BP diffusion region across the array. An isolation region extends over a portion of the BP diffusion region. A doped well region is formed within the substrate extending from a major surface of the substrate to a depth below a top level of the substantially continuous BP diffusion region. An electrical interconnection is also provided to the well region.

11 Claims, 4 Drawing Sheets

TRENCH CAPACITOR ARRAY HAVING WELL CONTACTING MERGED PLATE

BACKGROUND OF THE INVENTION

The invention relates to semiconductor structures and processing, especially those which include a trench capacitor array.

A goal of the semiconductor industry is to increase the circuit density of integrated circuits ("ICs" or "chips") by decreasing the size of individual devices and circuit elements of a chip. However, this reduction of size creates challenges for the design and fabrication of certain devices, including memory circuits. One particular problem relates to the design and fabrication of on-chip capacitors, such as those used as storage capacitors in on-chip memories. Capacitors that are provided above the surface of the semiconductor device layer, such as stacked capacitors, do not scale as well as transistors, such that they take up an increasing proportion of the area of the chip. Capacitors which are formed below the surface of the semiconductor device layer, such as trench capacitors, are being used increasingly because such capacitors can often be scaled in a better manner than stacked capacitors.

Trench capacitors are advantageously used because they allow capacitance to be increased without necessarily requiring an increase in the amount of surface area occupied by the memory cell. The capacitance of a trench capacitor can be increased by making the trench longer, i.e. deeper, or by widening a part of the trench that lies below the device region of the substrate, such process known as "bottling." The trench is typically filled with doped polysilicon, most commonly an n+ doped polysilicon, which serves as one plate of the capacitor, for example as a storage node, of a memory cell of a dynamic random access memory (DRAM). The second plate of the capacitor, referred to as a buried plate, is formed, for example, by outdiffusion of n+ dopants from a dopant source into a region of the substrate surrounding the lower portion of the trench. A dielectric layer separates the two plates of the capacitor.

FIG. 1 is a cross-sectional view illustrating a conventional trench capacitor array such as found in a DRAM. An array of trench capacitors 100 includes trench capacitors 110 formed in a substrate 101. Typically, the substrate is lightly doped with a p-type dopant. Each trench capacitor 110 includes a node dielectric and an n-type storage node 120, functioning as a storage electrode disposed in the trench. A buried plate region 130 is disposed in the substrate outside each trench and is doped with an n-type dopant, the buried plate thus surrounding the lower portions of the trenches.

One or more n-wells 170 are disposed at the periphery of the capacitor array 100, and may be provided as a ring structure surrounding the array 100. An n-band, shown at 160, connects the buried plate region 130 in the array to the n-wells. The purpose of the n-band is to maintain the buried plate of the array of trench capacitors at a uniform voltage, and to provide an electrical connection between the n-type buried plate region 130 and the n-type n-well 170. Contact to the n-band is made through the n-well, which extends downwardly from the surface to the buried n-band, permitting the n-band to be electrically biased.

Accordingly, it would be desirable to simplify the existing structure for contacting the buried plate and the method required to fabricate it.

SUMMARY OF THE INVENTION

According to an aspect of the invention, a structure is provided in which an array of trench capacitors includes a well contact to a merged buried plate diffusion region. The array, which is disposed in a substrate, includes a contact for receiving a reference potential. Each trench capacitor includes a node dielectric and a node conductor formed within the trench. Buried plate (BP) diffusions extend laterally outward from a lower portion of each trench of the array, the BP diffusions merging to form an at least substantially continuous BP diffusion region across the array. An isolation region extends over a portion of the BP diffusion region. A doped well region is formed within the substrate extending from a major surface of the substrate to a depth below a top level of the substantially continuous BP diffusion region. An electrical interconnection is also provided to the well region.

DETAILED DESCRIPTION OF THE DRAWINGS

The embodiments of the invention described herein simplify the fabrication of a trench capacitor array. The present invention provides a merged plate to well contact structure that does not have the prior art structural requirement of a doped band as discussed earlier in conjunction with prior art FIG. 1. An illustrative embodiment of the present invention is provided in FIG. 2.

Figure 2:
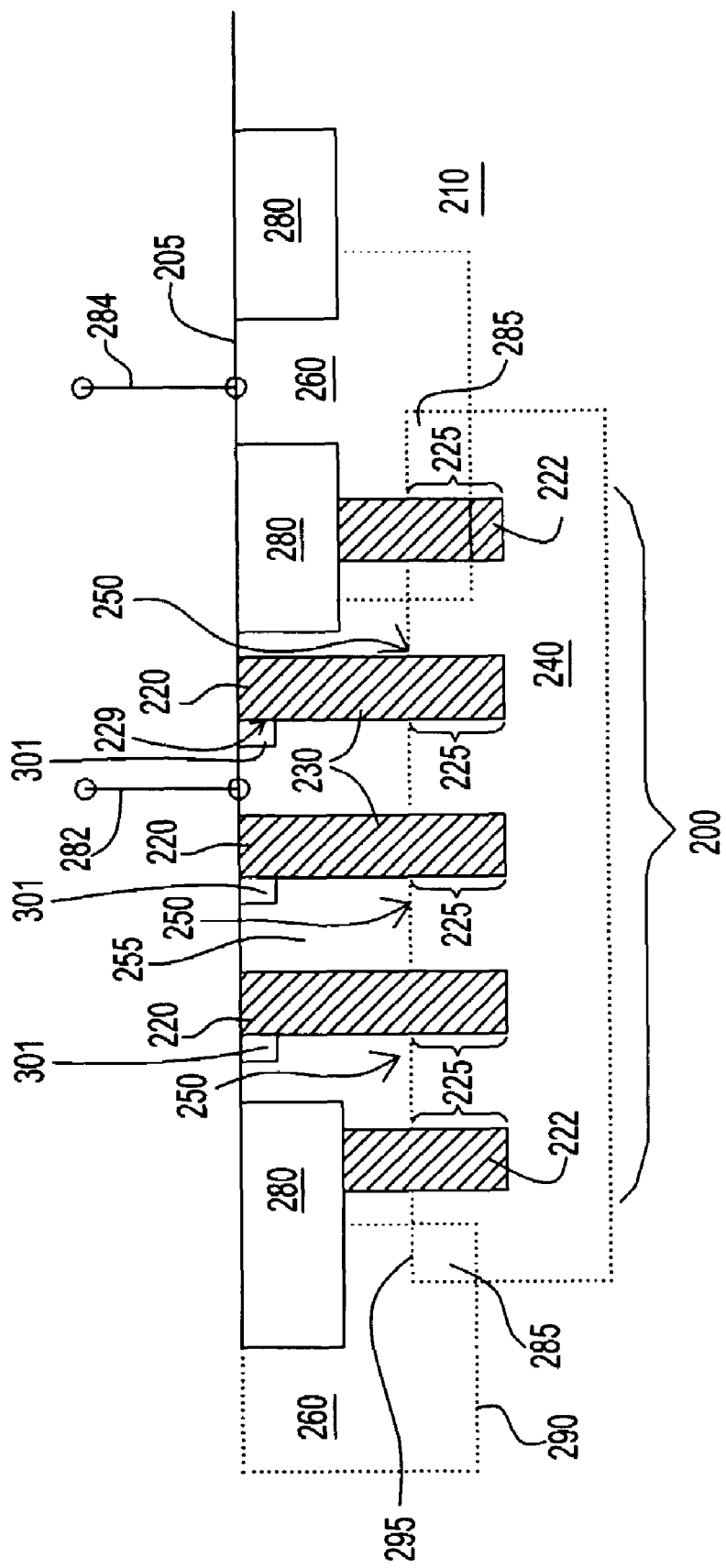
FIG. 2 is a cross-sectional view of an embodiment of trench capacitor array according to the present invention.

FIG. 2 is a cross-sectional view showing a simplified trench capacitor array, which allows for simpler fabrication. Illustratively, the trench capacitor array shown in FIG. 2, is suitable for use in an embedded DRAM utilizing n-channel MOSFETs. Alternatively, the trench capacitor array is provided in a DRAM. However, the present invention is not limited to application to memory devices such as DRAMs or eDRAMs. For example, embodiments of the invention can be utilized in trench capacitor structures to provide on-chip capacitance, e.g., for decoupling purposes.

As illustrated in the cross-sectional depiction of FIG. 2, a reference electrical interconnection 282, referred to as a p-well contact is provided to an array 200 of trench capacitors 250, which are formed in a well of p-type conductivity (a "p-well") 255 of the substrate 210. In addition, an isolation region such as a shallow trench isolation region (STI) 280, extends over a portion of the array 200. In the particular embodiment shown in FIG. 2, the STI 280 extends over a peripheral portion of the array 200.

The array 200 includes trench capacitors 250 formed in trenches 220, the trenches formed in the p-well region 255 of the substrate. The array 200 further includes dummy trenches 222 formed in the p-well, each having a buried plate (BP) that extends laterally outward from a lower portion 225 of each of the trenches, but merging together to form at least a substantially continuous BP diffusion region 240 across the array 200. As will be discussed in conjunction with the figures below, the present invention uses dummy trenches 222 at the array edge in order to spatially extend the buried plate diffusion region 240 from the trench capacitor array 200 outward to the n-well 260 at the periphery of the array. In FIG. 2, the series of trenches 220 and 222 provided in the array are all similar in structure. However, these trenches are differentiated by different references to emphasize the fact that the trenches denoted by 222 at the array edge are merely dummy trenches which do not have a circuit function like the other trenches 220 of the array 240.

The n-well 260 is disposed within the substrate at peripheral edges of the p-well 255. Preferably, the n-well substantially or completely surrounds the p-well. The n-well 260 extends from a major surface of the substrate to a depth 290 below a top level 295 of the BP diffusion region 240. The well 260 may be formed so as to overlap the isolation region 280 in order to assure the overlap between well 260 and the buried plate diffusion region 240 an electrical interconnection 284, referred to as an n-well contact, is provided to the n-well 260 at the major surface 205 of the substrate 210 to maintain the n-well and the buried plate 240 at a substantially constant potential.

In one embodiment of the present invention, substrate 210 is lightly doped. In the embodiment shown in FIG. 2, the substrate is doped with a p-type dopant such as boron (B). In addition, each of the trenches 220 and 222 are filled with a node conductor such as highly doped polysilicon (poly), deposited over a node dielectric to form a storage node 230. Typically, the storage node 230 is doped an n-dopant such as arsenic (As) or phosphorous (P). Alternatively, the substrate is doped with an n-type dopant and a p-well, doped with a p-type dopant, is disposed in place of the n-well.

Although not shown in full detail in FIG. 2, each trench capacitor 220 is typically closely coupled to an array transistor 229 formed in the substrate over the trench capacitor.

In another embodiment, the array 200 is an array of capacitors provided as a source of on-chip capacitance, for example, for decoupling purposes. In such case, the individual trench capacitor structures 250 of the array 200 are not connected individually to memory cell transistors. Rather, the array 200 is utilized as a unit.

The invention's dispensing with the prior art requirement to form a doped band, e.g. n-band, simplifies the array structure and saves several processing steps. Fabrication of a doped band in the prior art required such doping steps as a high-energy deep ion implantation step during which dopants had to be implanted at a pre-selected depth in the substrate. The desired depth of ion implantations had to be calculated beforehand and the ion implantation energy had to be adjusted to achieve the desired depth. In addition, in areas where ion implantation is undesirable, additional steps of patterning a mask layer prior to such ion implantation and removing the mask thereafter had to be performed, in addition to other steps such as planarization and post cleaning.

When used with a transistor having a planar topology, in a preferred embodiment of the present invention, the n-well merges with the top of the buried plate diffusion region. An illustrative depth of the top of the buried plate diffusion ranges from about 0.3 to about 1.5 microns (um), with 0.5 um being a most preferred depth. Therefore, the bottom of the n-well region ranges between 0.4 and 1.6 um with 0.6 nm being a preferred depth in such an embodiment. In a vertically arranged transistor, by contrast, the n-well will be deeper, with a depth measuring to the top of the buried plate diffusion region of about 0.5 to 1.8 um. In most cases, it would be prudent to have the n-well and buried plate diffusion region overlap by about 0.1 um to ensure good electrical connectivity.

Turning now to FIGS. 3 through 6, these figures illustrate stages in processing according to the embodiment of the invention shown in FIG. 2.

Illustratively, in this process, each trench is patterned in a single-crystal region of a bulk substrate 210, which typically consists essentially of p-type doped silicon. Alternatively, the substrate has a semiconductor-on-insulator type structure, e.g., is a silicon-on-insulator (SOI) substrate. Other suitable alternative types of substrates include germanium, silicon germanium, strained silicon, and those consisting essentially of one or more III-V compound semiconductors defined by the formula $Al_{X1}Ga_{X2}In_{X3}As_{Y1}P_{Y2}N_{Y3}Sn_{Y4}$, or alternatively, II-VI compound semiconductors.

Figures 3, 4, 5:
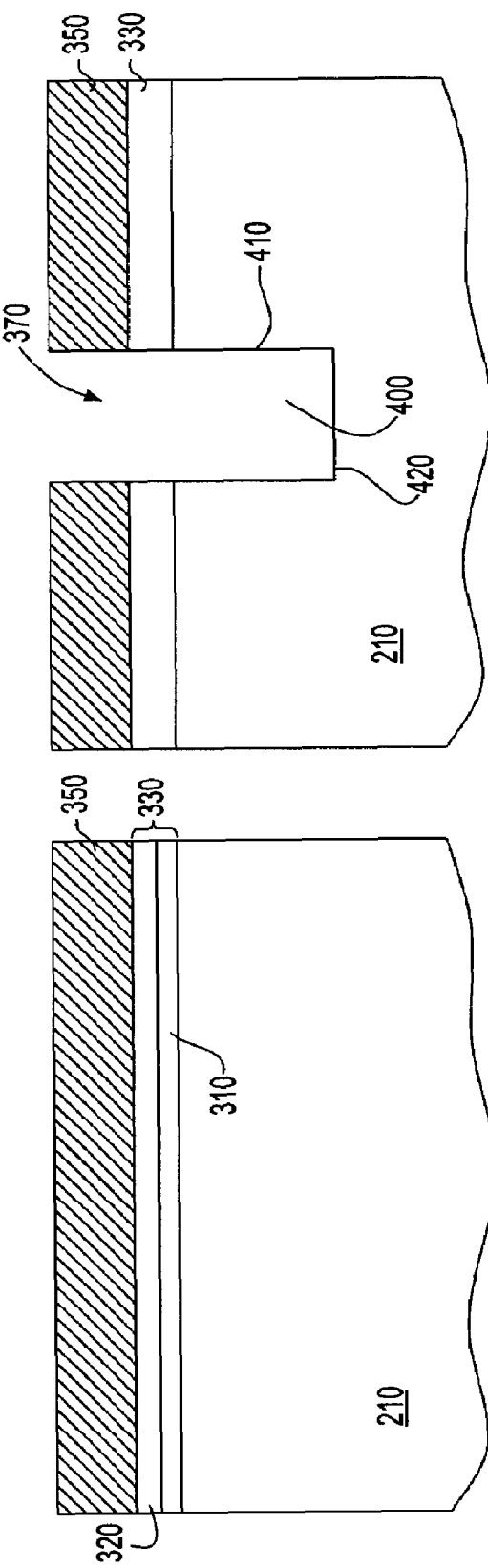
FIGS. 3 through 6 are cross-sectional views illustrating stages in a trench capacitor fabrication process according to the illustrative embodiment of FIG. 2.

A variety of methods may be utilized to form each deep trench, and same process can be used to process functional both the trenches 220 and the dummy trenches 222, as discussed above with reference to FIG. 2. Typically, a mask layer is first formed and patterned on the substrate, being comprised of a material less susceptible to etching, such as a hard mask layer. FIG. 3 shows one embodiment in which a hard mask layer 350 is deposited over a pad stack 330. The pad stack includes a pad nitride layer 320 and a pad stop layer 310, which is preferably an oxide layer.

With reference to FIG. 4, the hard mask layer 350 and the pad stack 330 are anisotropically etched by a process such as a reactive ion etch (RIE), to create a window 370 through which each trench is etched by an etching technique such as RIE. In a reactive ion etch, a beam of ions is directed towards a substrate, essentially in a vertical direction, accompanied by one or more reactive gases. The directed beam of ions causes sputtering of the exposed surfaces, such that small particles at the exposed surfaces break off and are carried away from the site of sputtering. This causes the etching to proceed primarily in one direction, the direction of the ion beam.

Thereafter, as shown in FIG. 4, the substrate 210 is etched by an anisotropic vertical etch process such as RIE to pattern the trench 400, which is representative of the trenches 220 and 222 as shown in FIG. 2. Once the trenches are etched, the hardmask 350, shown in FIG. 4, is subsequently removed.

Each of the trenches 400 has a very small width, typically at the minimum lithographic feature size (F), also referred to as the minimum lithographic half-pitch, for advanced devices according to the current generation of semiconductor devices. Each trench is typically etched to a depth that accommodates the requirements of the trench capacitor and array transistor, as discussed above in connection with FIG. 2. The depth of the trench is predetermined and processing is directed to achieving the predetermined depth. Etching defines each trench, having respective sidewalls 410 and a bottom 420, although an identifiable bottom surface may not always be present due to tapering of the trench towards the lower end of the trench. Hereinafter, references to the trench sidewalls generally and to the trench sidewall shall be understood to include the trench bottom 420, as well.

The formation of the buried plate diffusion region (FIG. 2) is achieved by one of a variety of different methods. In one method, for example, a liner 500 as provided in FIG. 5 and containing dopant such as arsenic (As) is deposited the trench sidewalls 410 and bottom 420. The dopant source layer is then formed or recessed to contact only a lower portion of the sidewalls. The substrate 210 is then heated to drive the dopant into the region surrounding the trench 220 and 222 to form the buried plate diffusion region 240.

Figure 6:
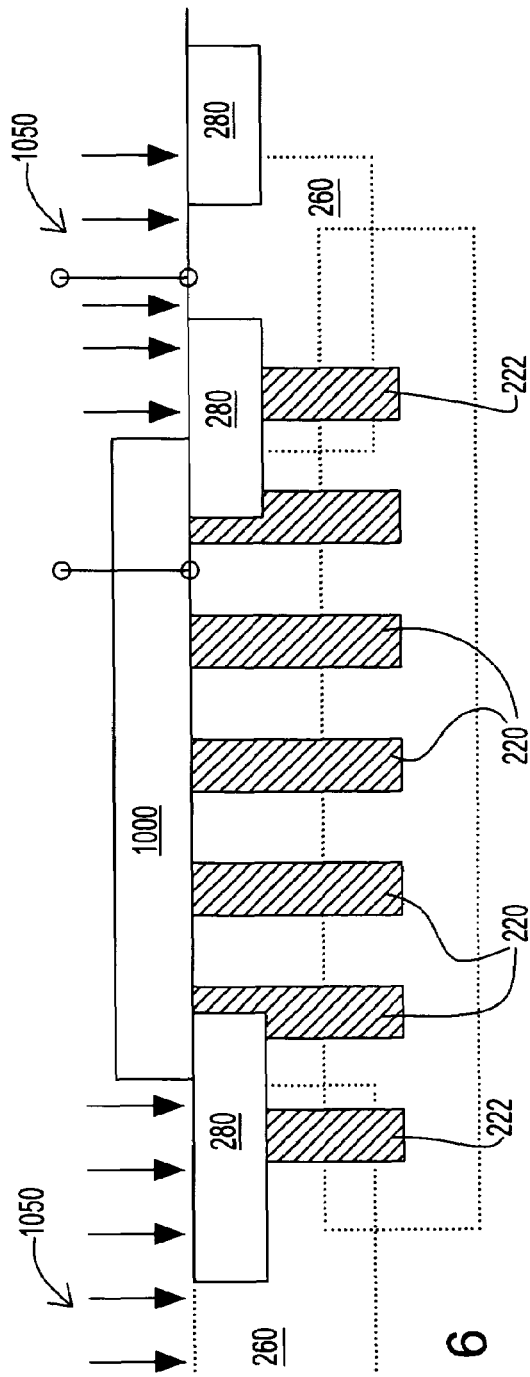

Once the buried plate diffusion region 240 is formed, further steps are used to complete the structure. Referring to FIG. 6, this includes implanting the n-wells. During such implant, the trenches 220 and 222 are masked so that only the areas that ultimately form the n-wells 260 will be implanted.

As shown in FIG. 6, the areas that will become the n-wells are implanted, as depicted by arrows 1050 while the other areas are protected by the mask 1000, thus creating the n-well illustrated in FIG. 6. As discussed before, the n-doping is such that the resulting n-well overlaps the buried plate region. Once the n-doping is completed, the mask 1000 of FIG. 6 is removed. The STI regions 280 are formed to overlap the n-well region, using the same trench etching methods discussed earlier. The STI regions 280 are preferably formed before implantation of the n-well regions, in order to avoid excessive diffusion of dopants which might occur during high temperature processing needed to form the STI regions.

Subsequent processing can now be performed to complete the capacitor fabrication. For example, a node dielectric is now formed in trenches 220 and then a node electrode is formed therein. Further processing may then be performed to form a transistor 301, such as, for example, a vertical transistor, in the substrate above the capacitor. In addition, the buried plate contacts are formed in the n-well regions.

Alternatively, instead of a vertical transistor, transistor 301 can be a planar transistor which connects to the trench capacitor 220. Those skilled in the art will understand the known processes which can be used to form such planar transistor. Alternatively, the trench capacitor can be simply connected to circuitry of the chip, such as for use in providing a source of local capacitance, e.g., for decoupling purposes.

Figure 1:
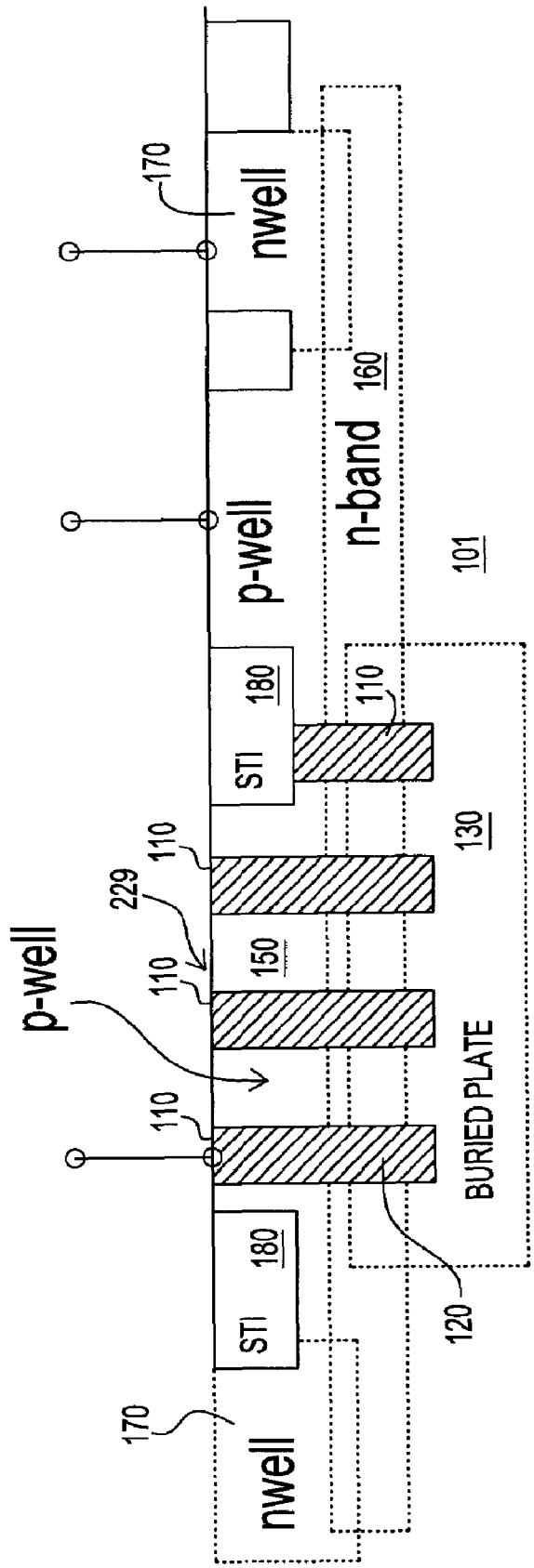
FIG. 1 is a cross sectional view of a prior art embodiment illustrating an n-band.

No matter how the storage capacitor is completed, the important concept remains that the present invention provides an alternative structure and process in place of the prior art structure and fabrication method involving a buried n-band, such as that shown in FIG. 1.

Figure 7:
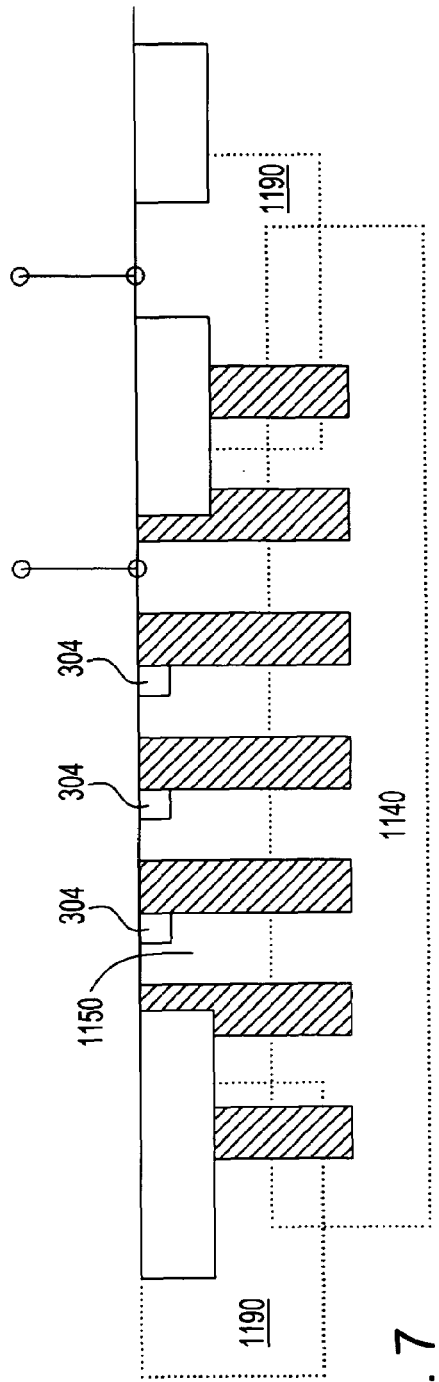
FIG. 7 is a cross-sectional view illustrating an alternative embodiment of a trench capacitor array according to the invention.

In an alternative embodiment, illustrated in FIG. 7, p-type doping is substituted in place of n-type doping, such that an array of p-type MOSFETs (PFETs) 304 is fabricated. Such embodiment is similar to the embodiment discussed in conjunction with that of FIG. 2, except that in this embodiment, the substrate is doped with an n-type dopant to form trench capacitor array area. To complete the process, p-wells 1190 are then created at the array edge, which overlap the buried plate diffusion region 1140, instead of the n-wells shown in FIG. 2.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A structure including a plurality of trench capacitors, comprising:
   a substrate including a single-crystal semiconductor region;
   a plurality of trenches in said single-crystal semiconductor region arranged in an array including a first dummy trench of said plurality of trenches defining a first peripheral edge of said array, a second dummy trench of said plurality of trenches defining a second peripheral edge of said array remote from said first peripheral edge, and a plurality of third trenches between said first and second dummy trenches, said array having a lateral dimension extending between said first and second peripheral edges;
   a plurality of trench capacitors, each having a node dielectric layer extending along a wall of a trench of said plurality of trenches, said plurality of trench capacitors having node dielectric layers along walls of said third trenches having a first circuit function, and each of said trench capacitors having node dielectric layers along walls of said first and second dummy trenches not having said first circuit function;
   a continuous buried plate diffusion region serving as a common capacitor plate belonging to all of said plurality of trench capacitors, said buried plate diffusion region having a lateral dimension equal to or larger than a lateral dimension of said array;
   an isolation region overlying a portion of said buried plate diffusion region and overlying at least said first dummy trench, said isolation region not overlying said third trenches;
   a doped well region laterally adjacent to said isolation region, said doped well region extending downwardly from a major surface of said single-crystal semiconductor region to a depth below a top level of said buried plate diffusion region at which said doped well region merges with said buried plate diffusion region; and
   a contact in conductive communication with said doped well region such that said doped well region provides a conductive path between said contact and said buried plate diffusion region for maintaining a common potential on said common capacitor plate belonging to all of said plurality of trench capacitors.

2. The structure of claim 1, wherein said substrate is a bulk single-crystal substrate.

3. The structure of claim 2, wherein said substrate consists essentially of a material selected from the group consisting of silicon, silicon germanium, strained silicon, and compound semiconductors.

4. The structure of claim 2, wherein said doped well region has n-type conductivity.

5. The structure of claim 2, wherein said doped well region has p-type conductivity.

6. The structure of claim 1, wherein said doped well region overlaps said isolation region.

7. The structure of claim 1, further comprising a plurality of planar transistors arranged in an array, each said planar transistor having an electrical connection to at least one trench capacitor of said plurality of trench capacitors.

8. The structure of claim 1, further comprising a plurality of vertical transistors arranged in an array in said single-crystal semiconductor region, said plurality of vertical transistors being electrically coupled to said plurality of trench capacitors having node dielectric layers along walls of said third trenches.

9. A method of forming a structure including a plurality of trench capacitors arranged in an array, comprising:
   a substrate including a single-crystal semiconductor region;
   forming a plurality of trenches in the single-crystal semiconductor region, the plurality of trenches being arranged in an array including a first dummy trench of the plurality of trenches defining a first peripheral edge of the array, a second dummy trench of the plurality of trenches defining a second peripheral edge of the array remote from the first peripheral edge and a plurality of third trenches between the first and second dummy trenches, the array having a lateral dimension extending between the first and second peripheral edges;

forming a plurality of trench capacitors including forming a continuous buried plate diffusion region in the single-crystal semiconductor region, the buried plate diffusion region having a lateral dimension equal to or larger than a lateral dimension of the array, and forming a node dielectric layer of each trench capacitor, the node dielectric layer extending along a wall of a trench of the plurality of trenches, the plurality of trench capacitors having node dielectric layers along walls of the third trenches having a first circuit function, and each of the trench capacitors having node dielectric layers along walls of the first and second dummy trenches not having the first circuit function;

forming a structure embedded in the single-crystal semiconductor region, the structure including a doped well region and an isolation region, the isolation region overlying a portion of the buried plate diffusion region and overlying at least the first dummy trench, the isolation region not overlying the third trenches, the doped well region being laterally adjacent to the isolation region, the doped well region extending downwardly from a major surface of the single-crystal semiconductor region to a depth below a top level of the buried plate diffusion region at which the doped well region merges with the buried plate diffusion region; and forming a contact in conductive communication with the doped well region to provide a conductive path through the doped well region to the buried plate diffusion region, the buried plate diffusion region serving as a common capacitor plate belonging to all of the plurality of trench capacitors.

10. The method of claim 9, further comprising forming a plurality of vertical transistors in the semiconductor region above the plurality of trench capacitors, the plurality of vertical transistors being conductively coupled to the plurality of trench capacitors having node dielectric layers along walls of said third trenches.

11. The method of claim 9, further comprising forming a plurality of planar transistors, the plurality of planar transistors being conductively coupled to the plurality of trench capacitors having node dielectric layers along walls of said third trenches.

* * * * *